United States Patent
Wei et al.

(10) Patent No.: US 11,532,645 B2
(45) Date of Patent: Dec. 20, 2022

(54) ARRAY SUBSTRATE AND METHOD OF MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Dongmei Wei, Beijing (CN); Hao Luo, Beijing (CN); Bo Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 104 days.

(21) Appl. No.: 17/007,780

(22) Filed: Aug. 31, 2020

(65) Prior Publication Data
US 2021/0183896 A1 Jun. 17, 2021

(30) Foreign Application Priority Data
Dec. 12, 2019 (CN) .......................... 201911275342.3

(51) Int. Cl.
*H01L 27/12* (2006.01)
(52) U.S. Cl.
CPC .......... *H01L 27/124* (2013.01); *H01L 27/127* (2013.01); *H01L 27/1218* (2013.01)
(58) Field of Classification Search
CPC ............. H01L 27/124; G02F 1/136213; G02F 1/136227
See application file for complete search history.

(56) References Cited

U.S. PATENT DOCUMENTS

2004/0239845 A1* 12/2004 Choi ................. G02F 1/133553
349/113
2006/0119771 A1* 6/2006 Lim .................... G02F 1/13458
349/114

(Continued)

FOREIGN PATENT DOCUMENTS

CN 101051134 A 10/2007
CN 101359139 A 2/2009

(Continued)

OTHER PUBLICATIONS

China National Intellectual Property Administration. Notification of the First Office Action dated Mar. 3, 2022. Chinese Application No. 201911275342.3. Chinese Language. 10 pages.

(Continued)

*Primary Examiner* — Peter M Albrecht
(74) *Attorney, Agent, or Firm* — Procopio, Cory, Hargreaves & Savitch LLP

(57) ABSTRACT

An array substrate includes a base, a plurality of thin film transistors, a passivation layer, at least one reflective electrode, and at least one first connecting electrode. The array substrate has a display area. The thin film transistors are disposed in the display area on the base. The passivation layer covers the thin film transistors, and has at least one first via hole in the display area. The reflective electrode is disposed on a surface of the passivation layer facing away from the base, and is disposed in the display area and uncovers the first via hole. The first connecting electrode is disposed on a side of the reflective electrode away from the base. Each first connecting electrode is connected to a corresponding reflective electrode, and is connected to a source or a drain of a corresponding thin film transistor through a corresponding first via hole.

15 Claims, 11 Drawing Sheets

(56) References Cited

U.S. PATENT DOCUMENTS

| | | |
|---|---|---|
| 2007/0236640 A1 | 10/2007 | Kimura |
| 2009/0020758 A1* | 1/2009 | Lee .................. G02F 1/1368 |
| | | 438/158 |
| 2009/0278449 A1 | 11/2009 | Choi et al. |
| 2010/0214518 A1 | 8/2010 | Chen et al. |
| 2015/0171154 A1 | 6/2015 | Kang |

FOREIGN PATENT DOCUMENTS

| | | |
|---|---|---|
| CN | 101577289 A | 11/2009 |
| CN | 101814511 A | 8/2010 |
| CN | 102832170 A | 12/2012 |
| CN | 104716143 A | 6/2015 |
| CN | 105223745 A | 1/2016 |

OTHER PUBLICATIONS

China National Intellectual Property Administration. Notification of the First Office Action dated Mar. 3, 2022. Chinese Application No. 201911275342.3. English Language Translation. 11 pages.

\* cited by examiner

ARRAY SUBSTRATE AND METHOD OF MANUFACTURING THE SAME, AND DISPLAY APPARATUS

CROSS-REFERENCE TO RELATED APPLICATION

This application claims priority to Chinese Patent Application No. 201911275342.3, filed on Dec. 12, 2019, which is incorporated herein by reference in its entirety.

TECHNICAL FIELD

The present disclosure relates to the field of display technologies, and in particularly, to an array substrate and a method of manufacturing the same, and a display apparatus.

BACKGROUND

Liquid crystal displays (LCDs) have been rapidly developed and widely applied due to the characteristics of small size, low power dissipation, no radiation, etc.

SUMMARY

In one aspect, an array substrate is provided. The array substrate has a display area. The array substrate includes: a base, a plurality of thin film transistors, a passivation layer, at least one reflective electrode, and at least one first connecting electrode. The thin film transistors are disposed in the display area on the base. The passivation layer covers the thin film transistors, and has at least one first via hole in the display area. The reflective electrode is disposed on a surface of the passivation layer facing away from the base, and is disposed in the display area and uncovers the first via hole. The at least one first connecting electrode is disposed on a side of the reflective electrode away from the base. Each first connecting electrode is connected to a corresponding reflective electrode, and is connected to a source or a drain of a corresponding thin film transistor through a corresponding first via hole.

In some embodiments, the first connecting electrode and the second connecting electrode are arranged in the same layer.

In some embodiments, the array substrate further has a peripheral area located on a periphery of the display area. The array substrate further includes a plurality of signal lines and at least one second connecting electrode. The signal lines are disposed in the peripheral area on the base, and the passivation layer further covers the signal lines and has a plurality of second via holes exposing the signal lines. The at least one second connecting electrode is disposed in the peripheral area, and the at least one second connecting electrode is disposed on a surface of the passivation layer facing away from the base, and each second connecting electrode is connected to two corresponding signal lines through two corresponding second via holes.

In some embodiments, the plurality of signal lines include at least one first signal line and at least one second signal line. The at least one first signal line is disposed in a same layer as the gate of the thin film transistor, and the at least one second signal line is disposed in a same layer as the source and the drain of the thin film transistor. The plurality of second via holes include at least one first contact via hole and at least one second contact via hole. Each second connecting electrode is connected to a corresponding first signal line through a corresponding first contact via hole, and is connected to a corresponding second signal line through a corresponding second contact via hole.

In some embodiments, the gate of the thin film transistor is closer to the base than the source and the drain of the thin film transistor. The array substrate further includes a gate insulating layer which is disposed between the gate and both the source and the drain, and the at least one first contact via hole further passes through the gate insulating layer. The thin film transistor further includes an active layer disposed between the gate and both the source and the drain, and the active layer is connected to both the source and the drain.

In some embodiments, the gate of the thin film transistor is closer to the base than the source and the drain of the thin film transistor. The thin film transistor further includes an active layer disposed between the gate and the base. The array substrate further includes a gate insulating layer and an interlayer insulating layer. The gate insulating layer is disposed between the gate and the active layer, and the interlayer insulating layer is disposed between the gate and both the source and the drain. The at least one first contact via hole further passes through the interlayer insulating layer. The source and the drain of the thin film transistor are connected to the active layer through respective via holes passing through both the interlayer insulating layer and the gate insulating layer.

In some embodiments, the array substrate further includes at least one first electrode and at least one second electrode. The at least one first electrode is disposed in the display area, and is disposed in a same layer as the gate of the thin film transistor. The at least one second electrode is disposed in the display area, and is disposed in a same layer as the source and the drain of the thin film transistor. Each second electrode is connected to a corresponding source or a corresponding drain. An orthographic projection of a first electrode on the base and an orthographic projection of a corresponding second electrode on the base overlap.

In some embodiments, the array substrate further includes a plurality of gate lines and a plurality of data lines. The gate lines are arranged in the display area, and are disposed in a same layer as the gate, extends along a first direction. The plurality of data lines are arranged in the display area, and are disposed in a same layer as the source and the drain of the thin film transistor, extends along a second direction perpendicular to the first direction. In the second direction, a maximum distance between a first side of an orthographic projection of a first electrode on the base and a first side of an orthographic projection of an adjacent gate line on the base is approximately 2 μm to approximately 4 μm. The first side of the orthographic projection of the first electrode on the base and the first side of the orthographic projection of the adjacent gate line on the base are two adjacent sides. In the first direction, a distance between a second side of the orthographic projection of the first electrode on the base and a first side of an orthographic projection of an adjacent data line on the base is approximately 2 μm to approximately 4 μm. The second side of the orthographic projection of the first electrode on the base and the first side of the orthographic projection of the adjacent data line on the base are two adjacent sides.

In some embodiments, an orthographic projection of each second electrode on the base is within a range of an orthographic projection of a corresponding first electrode on the base. A distance between at least a portion of a border of the orthographic projection of the second electrode on the base and a corresponding portion of a border of the orthographic projection of the corresponding first electrode on the base is approximately 0 μm to approximately 2 μm.

In some embodiments, the second electrode is insulating formed with a source or a drain of a corresponding thin film transistor.

In some embodiments, materials of the at least one first connecting electrode and the at least one second connecting electrode include amorphous indium tin oxide.

In some embodiments, a material of the at least one reflective electrode includes aluminum.

In another aspect, a method of manufacturing the array substrate described in any of the foregoing embodiments is provided. The method includes: providing the base; forming the thin film transistors in the display area on the base; forming a passivation film on a side of the thin film transistors away from the base; forming the at least one reflective electrode in the display area on the passivation film, a portion of the passivation film being not covered by the at least one reflective electrode; patterning the passivation film to form the passivation layer including the at least one first via hole that is uncovered by the at least one reflective electrode; and forming the at least one first connecting electrode on the side of the at least one reflective electrode away from the base. The at least one first connecting electrode is formed in the display area, a portion of the at least one first connecting electrode is formed on a surface of the passivation layer facing away from the base and passes through the at least one first via hole, and another portion of the at least one first connecting electrode is formed on a surface of the at least one reflective electrode facing away from the base.

In some embodiments, before forming the passivation film, the method further includes: forming a plurality of signal lines in a peripheral area of the array substrate while forming the thin film transistors. The passivation film covers the plurality of signal lines, and the passivation layer further has a plurality of second via holes in the peripheral area. After forming the at least one reflective electrode, the method further includes: forming at least one second connecting electrode in the peripheral area on the passivation layer while forming the at least one first connecting electrode. Each second connecting electrode is connected to two corresponding signal lines through two corresponding second via holes.

In some embodiments, forming the at least one reflective electrode includes: forming a metal film on the passivation film; and patterning the metal film through a wet etching process to form the at least one reflective electrode.

In some embodiments, the plurality of signal lines include at least one first signal line and at least one second signal line, and the plurality of second via holes includes at least one first contact via hole and at least one second contact via hole. Forming the plurality of signal lines includes: forming the at least one first signal line while forming the gate of the thin film transistor, and forming the at least one second signal line while forming the source and the drain of the thin film transistor. Patterning the passivation film to form the passivation layer includes: patterning the passivation film through a patterning process to form the at least one first via hole, the at least one first contact via hole, and the at least one second contact via hole. Each first via hole exposes a source or a drain of a corresponding thin film transistor, each first contact via hole exposes a corresponding first signal line, and each second contact via hole exposes a corresponding second signal line.

In some embodiments, forming the at least one first connecting electrode and the at least one second connecting electrode includes: forming a conductive film on a side of the at least one reflective electrode away from the base; and patterning the conductive film through a patterning process to form the at least one first connecting electrode and the at least one second connecting electrode.

In some embodiments, the method further includes: forming at least one first electrode in the display area while forming the gate of the thin film transistor; and forming at least one second electrode in the display area while forming the source and the drain of the thin film transistor. Each second electrode is connected to a corresponding source or a corresponding drain. An orthographic projection of a first electrode on the base and an orthographic projection of a corresponding second electrode on the base overlap.

In yet another aspect, a display apparatus is provided. The display apparatus includes the array substrate described in any of the foregoing embodiments, an opposite substrate disposed opposite to the array substrate, and a liquid crystal layer disposed between the array substrate and the opposite substrate.

BRIEF DESCRIPTION OF THE DRAWINGS

In order to describe the technical solutions in embodiments of the present disclosure more clearly, the accompanying drawings to be used in description of embodiments will be introduced briefly. However, the accompanying drawings to be described below are merely some embodiments of the present disclosure, and a person of ordinary skill in the art can obtain other drawings according to those drawings without paying any creative effort. In addition, the accompany drawings to be described below may be regarded as schematic diagrams, and are not limitations on actual sizes of products, actual processes of methods to which the embodiments of the present disclosure relate.

DETAILED DESCRIPTION

Figure 1:
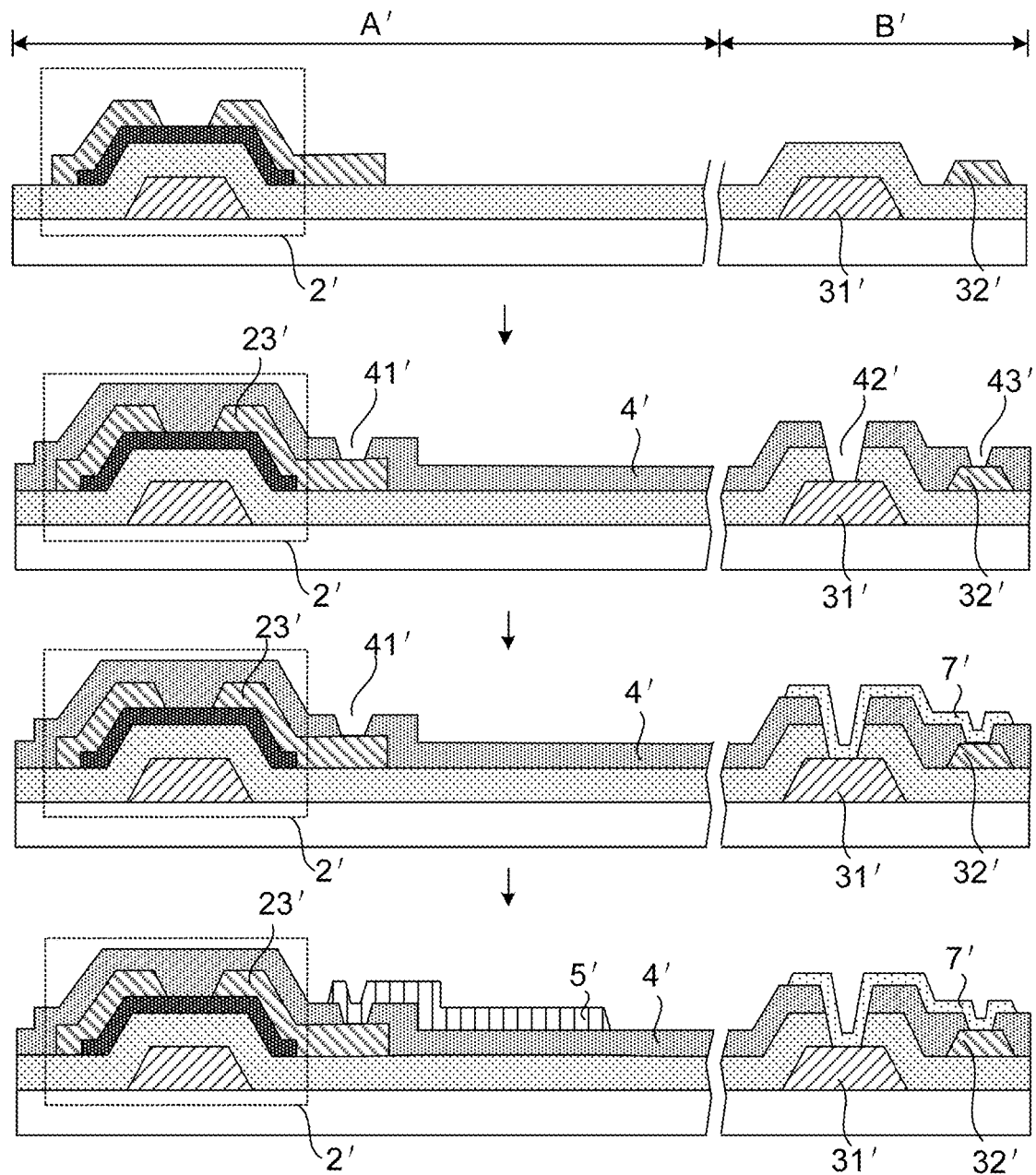
FIG. 1 is a schematic diagram showing a process of manufacturing an array substrate in the related art.

The technical solutions in some embodiments of the present disclosure will be described clearly and completely with reference to the accompanying drawings in the embodiments of the present disclosure. However, the described embodiments are merely some but not all of the embodiments of the present disclosure. All other embodiments made on the basis of the embodiments of the present disclosure by a person of ordinary skill in the art without paying any creative effort shall be included in the protection scope of the present disclosure.

Unless the context requires otherwise, throughout the specification, the word "comprise" and other forms thereof, such as, the third-person singular form "comprises" and the present participle form "comprising" are construed as an open and inclusive sense, that is "inclusive, but not limited to." In the description of the specification, terms such as "one embodiment", "some embodiments", "exemplary embodiments", "example", "specific example" or "some examples", and the like are intended to indicate that specific features, structures, materials or characteristics related to the embodiment(s) or the example(s) are included in at least one embodiment or example of the present disclosure. Schematic expression of the above terms do not necessarily refer to same embodiment(s) or example(s). In addition, the specific features, structures, materials or characteristics may be included in any one or more embodiments or examples in any suitable manner.

Words such as "first" and "second" are only used for descriptive purpose and are not to be construed as indicating or implying relative importance or implicitly indicating the number of indicated technical features below. Thus, features defined by the words "first" and "second" may explicitly or implicitly include one or more of the features. In the description of the embodiments of the present disclosure, both the terms "a plurality of" and "the plurality of" mean two or more unless otherwise specified.

It will be understood that, when it is described that an element is "connected" to another element, the element may be directly coupled or directly connected to the other element or coupled or connected to the other element through a third element. On the contrary, it will be understood that when an element is referred to as being "directly connected to" another element, another element does not intervene therebetween. Other expressions which describe the relationship between assemblies, that is, "between" and "directly between", or "adjacent to" and "directly adjacent to" need to be interpreted by the same manner.

It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

"Approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

It will be understood that, a transistor refers to a component at least including three terminals, i.e., a gate, a drain (also called a drain terminal, a drain region or a drain electrode) and a source (also called a source terminal, a source region or a source electrode). The transistor has a channel between the drain and the source, and an electric current can flow through the drain, the channel and the source. It will be noted that, in the specification, the channel refers to a region where the electric current mainly flows through. In addition, the source and the drain may be exchanged in the embodiments of the present disclosure.

In the specification, the word "film" may also be called "layer". For example, the "insulating film" may be called the "insulating layer". The word "layer" may also be called "film". For example, the "conductive layer" may also be called the "conductive film".

Patterning process in the specification is a mature process in the related art, and includes a photolithography process, or a process including a photolithography process and an etching process. The photolithography process refers to a process that includes a film formation (for example, a film formation by chemical vapor deposition (CVD), sputtering, or evaporation), an exposure, a development, and the like, and that forms a pattern by using a photoresist, a mask, an exposure machine, and the like. It will be noted that, a "film" refers to a layer of film that is formed on a base by a deposition or coating process and is made of a certain material. If the patterning process is unnecessary in an entire process of forming the "film", the "film" may be called a "layer". If the patterning process is necessary in the entire process of forming the "film", the "film" before the patterning process is performed may be called a "film", and the "film" after the patterning process is performed may be called a "layer" that includes at least one "pattern".

According to types of light sources adopted in a liquid crystal display (LCD), the type of the LCD may be a transmission type, a reflection type, or a semi-transmission and semi-reflection type. The reflection-type LCD refers to an LCD including a reflective layer that is provided in the array substrate and that can reflect natural light incident from the outside, so that the LCD may realize image display through the natural light reflected by the reflective layer. That is to say, the reflection-type LCD takes natural light as a light source, and does not need a backlight, which may largely reduce power consumption of the reflection-type LCD and effectively prolong endurance time of the reflection-type LCD. On this basis, the reflection-type LCD may be applied to a wearable electronic device, such as a smart watch or a smart band.

In the related art, the LCD includes an array substrate. As shown in FIG. 1, the array substrate has a display area A' and a peripheral area B' surrounding the display area A'. The array substrate includes thin film transistors 2' and a reflective layer 5' located in the display area A', and a peripheral circuit located in the peripheral area B'. The peripheral circuit includes a plurality of signal lines used for providing electrical signals to the thin film transistors 2'. For example, the plurality of signal lines includes first signal lines 31' and second signal lines 32'.

As shown in FIG. 1, in a process of manufacturing the array substrate, the thin film transistors 2', the first signal lines 31', and the second signal lines 32' are formed firstly, in which the thin film transistors 2' are formed in the display area A' and the first signal lines 31' and the second signal lines 32' are formed in the peripheral area B'. A passivation layer 4' is then formed, which covers the thin film transistors 2', the first signal lines 31' and the second signal lines 32', and the passivation layer 4' includes electrode via holes 41' located in the display area A' and switching via holes 42' and 43' located in the peripheral area B'. The electrode via hole 41' is used for exposing a drain 23' of the thin film transistor 2', and two switching via holes 42' and 43' are used for exposing the first signal line 31' and the second signal line 32', respectively. Next, connecting electrodes 7' are formed in the peripheral area B' by using a transparent conductive material. The connecting electrode 7' is connected to the first signal line 31' and the second signal line 32' through the switching via holes 42' and 43', respectively. Finally, the reflective layer 5' is formed in the display area A'. The reflective layer 5' is connected to the drain 23' through the electrode via hole 41'.

However, due to the low compactness of the connecting electrode 7' made of the transparent conductive material, in the process of forming the reflective layer 5' by etching, the etching solution easily passes through the connecting electrode 7', and corrodes the first signal line 31' and the second signal line 32', thereby causing reliability problems such as poor contact or even short circuit in the peripheral circuit in the peripheral area B', which may reduce the reliability of the peripheral circuit.

Figure 2:
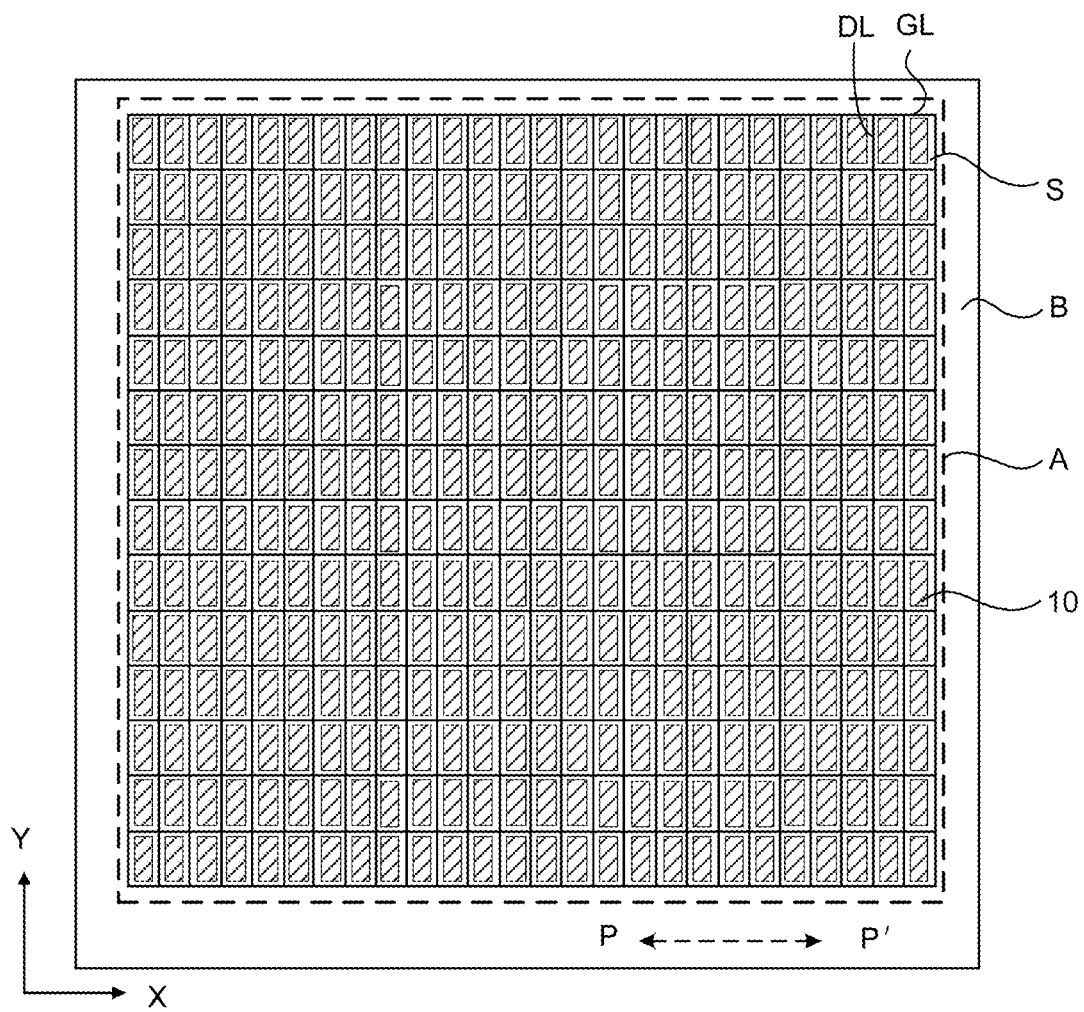
FIG. 2 is a top view of an array substrate, according to some embodiments.

In some embodiments of the present disclosure, an array substrate 100 is provided. As shown in FIG. 2, the array substrate 100 has a display area A and a peripheral area B located on a periphery of the display area A. For example, the display area A is in a shape of a rectangle, and the peripheral area B may be located on one side, two sides, three sides, or all sides (as shown in FIG. 2) of the display area A. Of course, the display area A may also have other shapes, such as a circular shape. In this case, the peripheral area B may surround the display area A.

In some embodiments, as shown in FIG. 2, the display area A includes a plurality of sub-pixel regions S arranged in an array.

In some examples, as shown in FIG. 2, the array substrate 100 includes a plurality of gate lines GL and a plurality of data lines DL located in the display area A. The plurality of gate lines GL extend along a first direction X, and the plurality of data lines DL extend along a second direction Y perpendicular to the first direction X. That is, the gate lines GL and the data lines DL cross, thereby defining the plurality of sub-pixel regions S.

Figure 3:
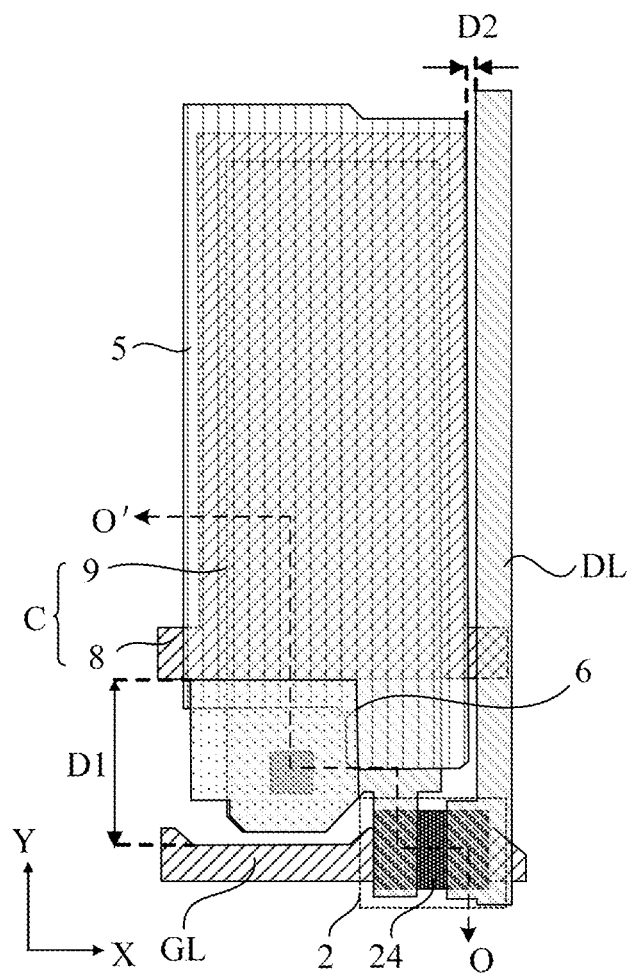
FIG. 3 is a structural diagram of a sub-pixel of an array substrate, according to some embodiments.

In some embodiments, as shown in FIGS. 2 and 3, the sub-pixel region S is provided with one sub-pixel 10 therein, and the sub-pixel 10 is connected to a corresponding gate line GL and a corresponding data line DL. The sub-pixels 10 arranged in a row along the first direction X may be called a same row of sub-pixels, and the same row of sub-pixels 10 are connected to a same gate line GL. The sub-pixels 10 arranged in a column along the second direction Y may be called a same column of sub-pixels, and the same column of sub-pixels are connected to a same data line DL.

Figure 4:
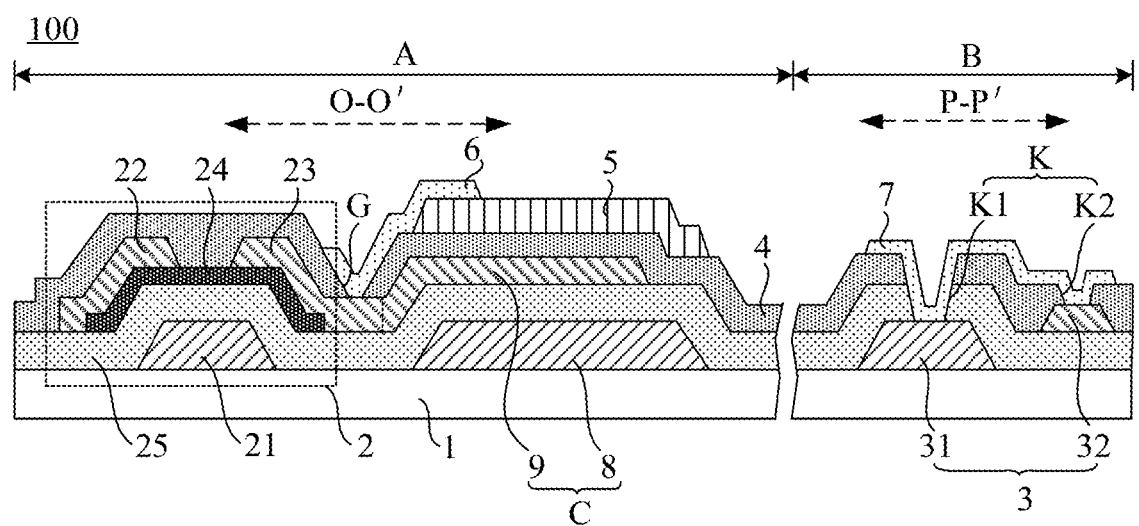
FIG. 4 is a diagram showing a cross-section of an array substrate taken along line P-P in FIG. 2 and a cross-section of the array substrate taken along line O-O' in FIG. 3.
Figure 5:
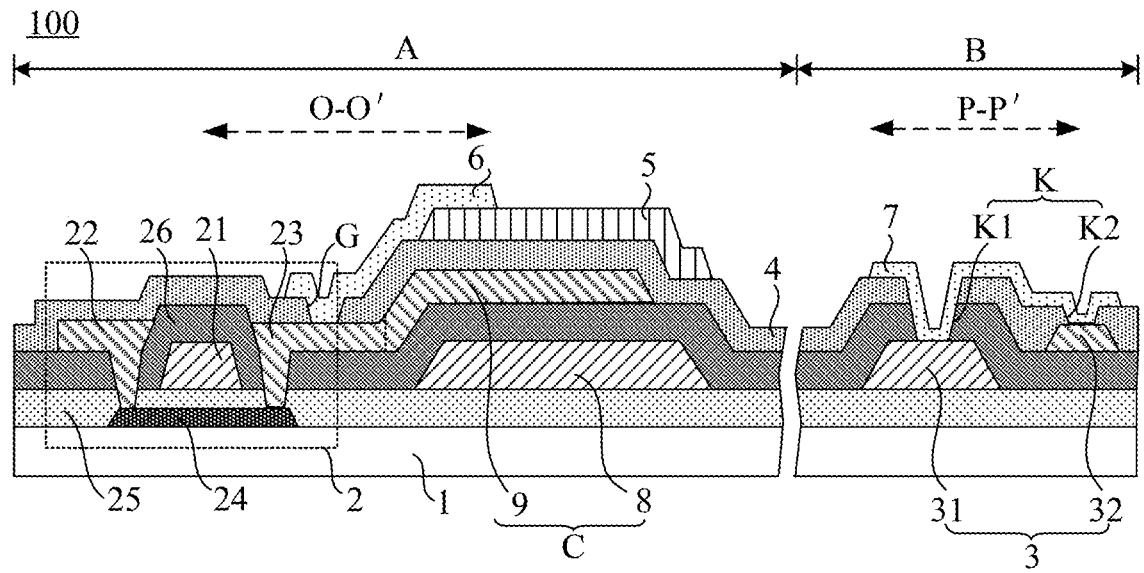
FIG. 5 is another diagram showing a cross-section of an array substrate taken along line P-P in FIG. 2 and a cross-section of the array substrate taken along line O-O' in FIG. 3.

FIG. 4 is a diagram showing a cross-section of the array substrate 100 taken along the line P-P' in FIG. 2 and a cross-section of the array substrate 100 taken along the line O-O' in FIG. 3. FIG. 5 is diagram showing another cross-section of the array substrate 100 taken along the line P-P' in FIG. 2 and another cross-section of the array substrate 100 taken along the line O-O' in FIG. 3. It will be noted that in order to describe the embodiments clearly, FIGS. 4 and 5 only show a partial structure of the array substrate 100, which means that the components or layers shown in the drawings may be portions of the components or layers of the array substrate 100.

In some embodiments, as shown in FIGS. 4 and 5, the array substrate 100 further includes a base 1, and the gate lines GL, the data lines DL and the sub-pixels 10 are located on the base 1. In some examples, the base 1 is a base on which no films or layers have been provided. In some other examples, the base 1 is a base provided with at least one functional layer, such as an insulating layer and/or a buffer layer. The at least one functional layer may be disposed on at least one side, such as two opposite sides, of the base 1. The base 1 is made of a transparent material, such as glass, quartz, or plastic.

The base 1 may include a polymer resin or glass. In some examples, the base 1 may include a polymer resin such as one of polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and cellulose acetate propionate (CAP). The base 1 may be flexible. The base 1 may include a glass material containing SiO2 as a main component or may include a resin such as a reinforced plastic, and may be rigid.

In some embodiments, as shown in FIGS. 3 to 5, the array substrate 100 further includes thin film transistors 2 disposed in the display area A on the base 1. For example, each thin film transistor 2 is arranged in a corresponding sub-pixel region S. That is, each sub-pixel 10 includes a thin film transistor 2.

In some examples, as shown in FIGS. 3 to 5, the thin film transistor 2 includes a gate 21, a source 22 and a drain 23, and the gate 21 is disposed on a side of the source 22 and the drain 23 proximate to the base 1. The gate 21 may be disposed in the same layer as the gate lines GL, and is connected to a corresponding gate line GL. The source 22 and the drain 23 may be disposed in the same layer as the data lines DL, and the source 22 or the drain 23 is connected to a corresponding data line DL.

It will be noted that, in the specification, the same layer means that a film is formed by the same film forming process and then is patterned by one patterning process using the same mask. Depending on the different specific patterns in the layer, the patterning process may include several exposure, development and/or etching processes. The specific patterns may be continuous or discontinuous, and may also be at different heights or have different thicknesses.

By arranging the gate 21 in the same layer as the gate lines GL, the gate 21 and the gate lines GL may be formed synchronously, and thus the manufacturing process may be simplified. In addition, by arranging the source 22 and the drain 23 in the same layer as the data lines DL, the source 22, the drain 23 and the data lines DL may be formed synchronously, and thus the manufacturing process may be further simplified.

In some embodiments, as shown in FIGS. 4 and 5, the array substrate 100 further includes a passivation layer 4 covering the thin film transistors 2. The passivation layer 4 has at least one first via hole G in the display area A, and the first via hole G is used for exposing the source 22 or the drain 23 (the drain 23 is taken as an example in FIGS. 4 and 5 for illustrating). For example, the at least one first via hole G includes a plurality of first via hole G, and each first via hole G is arranged in a sub-pixel region S.

Herein, the passivation layer 4 may be a thin film formed on the entire surfaces of the thin film transistors 2, and may be arranged in the display area A. In this case, the passivation layer 4 covers the gate lines GL and data lines DL.

In some embodiments, as shown in FIGS. 3 to 5, the array substrate 100 further includes at least one reflective electrode 5 (may also be called reflective layer) disposed on a surface of the passivation layer 4 facing away from the base 1. The at least one reflective electrode 5 is located in the display area A, and does not cover the at least one first via hole G.

For example, the at least one reflective electrode 5 includes a plurality of reflective electrodes 5, and each reflective electrode 5 is arranged in a sub-pixel region S and does not cover the first via hole G in the sub-pixel region S.

It will be noted that the reflective electrode 5 is used for reflecting natural light incident from the outside, so as to provide light for displaying images. In addition, when the array substrate 100 is applied to the LCD, the reflective electrode 5 may also be used as a pixel electrode, cooperating with the common electrode in the LCD to generate an electric field for driving liquid crystal molecules in the liquid crystal layer to deflect.

In some embodiments, the reflective electrode 5 may be made of various materials. The material of the reflective electrode 5 may be selected according to actual needs, as long as the material has high reflectivity so that the light reflected by the material may serve as a light source of the LCD. For example, the material of the reflective electrode 5 may be metal material, such as silver (Ag), copper (Cu), Aluminum (Al), or molybdenum (Mo), or an alloy material of the metal materials.

In some embodiments, as shown in FIGS. 3 to 5, the array substrate 100 further includes at least one first connecting electrode 6 disposed on a side of the at least one reflective electrode 5 away from the base 1. Each first connecting electrode 6 is connected to a corresponding reflective electrode 5, and is connected to a source 22 or a drain 23 of a corresponding thin film transistor 2 through a corresponding first via hole G.

For example, the at least one first connecting electrode 6 includes a plurality of first connecting electrode 6, and each first connecting electrode 6 is arranged in a sub-pixel region S. In the sub-pixel region S, the first connecting electrode 6 is connected to the reflective electrode 5, and is connected to the source 22 or the drain 23 of the thin film transistor 2 through the first via hole G. In this way, in the sub-pixel region S, the thin film transistor 2 may be connected to the reflective electrode 5 through the first connecting electrode 6.

It will be noted that, in a case where the source 22 of the thin film transistor 2 is connected to the data line DL, the first connecting electrode 6 is connected to the drain 23 of the thin film transistor 2; and in a case where the drain 23 of the thin film transistor 2 is connected to the data line DL, the first connecting electrode 6 is connected to the source 22 of the thin film transistor 2.

According to the structure of the array substrate 100 described above, in the process of manufacturing the array substrate 100, a passivation film (which is used for forming the passivation layer 4 in latter process) may be formed firstly after the thin film transistors 2 are formed, so as to cover the thin film transistors 2. Then, the at least one reflective layer 5 is formed in the display area A on the passivation film by an etching process. Next, the at least one first via hole G of the passivation layer 4 is formed by performing an etching process on the passivation film. In turn, the at least one first connecting electrode 6, each of which is used for connecting the reflective layer 5 to the source 22 or the drain 23 of the thin film transistor 2, is formed.

In this case, as shown in FIG. 4, second via holes K, which are used for exposing the signal lines 3 in the peripheral area B, may be formed in the passivation layer 4 synchronously with the at least one first via hole G. In addition, second connecting electrodes 7 used for connecting the signal lines 3 arranged in the peripheral area B may be formed synchronously with the at least one first connecting electrode 6. That is to say, in the process of manufacturing the array substrate 100, the at least one reflective layer 5 is formed before the second via holes K and the second connecting electrodes 7 are formed. Since in the process of forming the at least one reflective layer 5, the passivation layer 4 exists on the signal lines 3, the etching solution may be prevented from reaching the signal lines 3 by the passivation layer 4, thereby preventing the signal lines 3 from being corroded, and improving the quality of the array substrate 100.

In some embodiments, as shown in FIGS. 4 and 5, the array substrate 100 further includes a plurality of signal lines 3 and at least one second connecting electrode 7. The plurality of signal lines 3 are disposed in the peripheral area B on the base 1, and are covered by the passivation layer 4. The passivation layer 4 further has a plurality of second via holes K in the peripheral area B, and the plurality of second via holes K are used for exposing portions of the plurality of signal lines 3. The at least one second connecting electrode 7 is arranged in the peripheral area B and is disposed on a side of the passivation layer 4 away from the base 1. Each second connecting electrode 7 is connected to two corresponding signal lines 3 through two corresponding second via holes K.

In some embodiments, the signal lines 3 are configured to transmit electric signals to the gate lines GL and/or data lines DL. For example, the signal lines 3 may be wires of a driver circuit (such as, a data driver circuit or a scan driver circuit), or wires used for connecting the driver circuit to the gate lines GL or data lines DL.

In some examples, the at least one second connecting electrode 7 includes a plurality of second connecting electrodes 7, and each second connecting electrode 7 is connected to two corresponding signal lines 3 through two corresponding second via holes K.

In some examples, the second connecting electrode 7 and the first connecting electrode 6 are arranged in the same layer, so that the second connecting electrode 7 and the first connecting electrode 6 may be formed synchronously to simplify the manufacturing process. It will be noted that, the first connecting electrode 6 and the second connecting electrode 7 may be made of various materials, and the materials may be selected according to actual needs. For example, the materials of the first connecting electrode 6 and the second connecting electrode 7 may be transparent conductive materials, such as indium tin oxide (ITO), indium zinc oxide (IZO), or amorphous indium tin oxide ($\alpha$-ITO).

In some examples, in the case where the material of the reflective electrode 5 is Al, the materials of the first connecting electrode 6 and the second connecting electrode 7 may be $\alpha$-ITO. In this way, in the process of forming the first connecting electrode 6 and the second connecting electrode 7 through the patterning process, the corrosion to the reflective electrode 5 by the etching solution may be avoided, thereby avoiding the structure and property of the reflective electrode 5 being affected.

In some embodiments, as shown in FIGS. 4 and 5, the plurality of signal line 3 includes at least one first signal line 31 and at least one second signal line 32. For example, the at least one first signal line 31 includes a plurality of first signal lines 31, and the at least one second signal line 32 includes a plurality of second signal lines 32.

In some examples, as shown in FIGS. 4 and 5, the first signal lines 31 are disposed in the same layer as the gate 21, and the second signal lines 32 are disposed in the same layer as the source 22 and the drain 23. In this way, the first signal lines 31 and the gate 21 may be formed synchronously, and the second signal lines 32, the source 22 and the drain 23 may be formed synchronously, which may simplify the manufacturing process of the array substrate 100.

In some embodiments, as shown in FIGS. 4 and 5, the plurality of second via holes K includes at least one first contact via hole K1 and at least one second contact via hole K2. Each first contact via hole K1 is used for exposing a corresponding first signal line 31, and each second contact via hole K2 is use for exposing a corresponding second signal line 32. In this case, each second connecting electrode 7 may be connected to a corresponding first signal line 31 through a corresponding first contact via hole K1, and be connected to a corresponding second signal line 32 through a corresponding second contact hole K2.

In this case, a first signal line 31 and a corresponding second signal line 32 are connected through a second connecting electrode 7. In this way, the electric signal transmitted in the first signal line 31 may be transmitted to the second signal line 32 through the second connecting electrode 7, and an electric signal transmitted in the second signal line 32 may be transmitted to the first signal line 31 through the second connecting electrode 7.

In some examples, as shown in FIGS. 4 and 5, the thin film transistor 2 further includes an active layer 24. A conductive layer in which the gate 21 is disposed may be defined as a first conductive layer (also called a gate conductive layer), and another conductive layer in which the source 22 and the drain 23 are disposed may be defined as a second conductive layer (also called a source-drain conductive layer). The first conductive layer is closer to the base 1 than the second conductive layer.

In some embodiments, as shown in FIG. 4, the array substrate 100 further includes a gate insulating layer 25 disposed between the first conductive layer and the second conductive layer. The active layer 24 is disposed between the gate insulating layer 25 and the second conductive layer, and is connected to the source 22 and the drain 23 directly. The thin film transistor 2 shown in FIG. 4 may be called a bottom-gate thin film transistor. As shown in FIG. 4, the gate insulating layer 25 covers the first conductive layer. In the case where the first signal lines 31 are disposed in the same layer as the gate 21, the gate insulating layer 25 further covers the first signal lines 31, and the first contact via hole K1 also passes through the gate insulating layer 25 to expose the first signal line 31.

In some other embodiments, as shown in FIG. 5, the active layer 24 is disposed between the first conductive layer and the base 1. The thin film transistor 2 shown in FIG. 5 may be called a top-gate thin film transistor. In some examples, as shown in FIG. 5, the array substrate 100 further includes a gate insulating layer 25 and an interlayer insulating layer 26. The gate insulating layer 25 is arranged between the first conductive layer and the active layer 24. The interlayer insulating layer 26 is arranged between the first conductive layer and the second conductive layer. The source 22 and the drain 23 are connected to the active layer 24 through respective via holes passing through both the interlayer insulating layer 26 and the gate insulating layer 25.

The interlayer insulating layer 26 covers the first conductive layer. In the case where the first signal lines 31 are disposed in the same layer as the gate 21, the interlayer insulating layer 26 further covers the first signal line 31, and the first contact hole K1 further passes through the interlayer insulating layer 26 to expose the first signal line 31.

In some embodiments, as shown in FIGS. 3 to 5, the array substrate 100 further includes at least one first electrode 8 and at least one second electrode 9 that are disposed in the display area A. The at least one first electrode 8 may be arranged in the same layer as the gate 21, and the at least one second electrodes 9 may be arranged in the same layer as the source 22 and the drain 23. In this case, the insulating layer (i.e., the gate insulating layer 25 or the interlayer insulating layer 26) disposed between the source 22 and the gate 21 is also disposed between the first electrode 8 and the second electrodes 9, so that the first electrode 8 and the second electrode 9 are insulated. The first electrode 8, the second electrode 9 and a portion of the insulting insulating layer therebetween constitute a storage capacitor C.

In this way, the first electrode 8 and the gate 21 may be formed synchronously to simplify the manufacturing process. The second electrode 9, the source 22 and the drain 23 may be formed synchronously to simplify the manufacturing process.

In some examples, the at least one first electrode 8 includes a plurality of first electrodes 8, the at least one second electrode 9 includes a plurality of second electrodes 9, and each first electrodes 8 and the corresponding second electrode 9 are disposed in a same sub-pixel region S. For example, as shown in FIG. 3, the plurality of second electrodes 9 are integrally formed. That is, two adjacent second electrodes 9 in the row or column are electrically connected.

In some examples, as shown in FIG. 4, the second electrode 9 is connected to the source 22 or the drain 23. The array substrate 100 further includes a common electrode wire, and the at least one first electrode 8 is connected to the common electrode wire.

In this way, when the array substrate 100 is applied to the LCD, an electric field will be generated between the reflective electrode 5 and the common electrode in an opposite substrate when the thin film transistor 2 is turned on, and the electric field may drive liquid crystal molecules in the LCD to deflect; meanwhile, the storage capacitor C including the first electrode 8 and the second electrode 9 can be charged by the electric field. The storage capacitor C may discharge when the thin film transistor 2 is turned off, and an electric field existing between the reflective electrode 5 and the common electrode can be maintained, so that the liquid crystal molecules in the LCD can maintain deflection.

In some embodiments, the second electrode 9 is integrally formed with the drain 22 or the drain 23, and the plurality of first electrodes 8 are integrally formed with the common electrode wire, which may simplify the process of forming the second electrode 9 and the source 22 or the drain 23 and the process of forming the first electrodes 8 and the common electrode wire, thereby simplifying the process of manufacturing the array substrate 100.

In some embodiments, as shown in FIG. 3, in a direction perpendicular to the extending direction of the gate line GL (i.e., in the second direction Y), the maximum distance D1 between a first side of an orthographic projection of the first electrode 8 on the base 1 and a first side of an orthographic projection of the adjacent gate line GL on the base 1 is approximately 2 μm to approximately 4 μm, such as 2 μm, 2.5 μm, 3 μm, 3.5 μm, or 4 μm. It will be noted that the first side of the orthographic projection of the first electrode 8 on the base 1 and the first side of the orthographic projection of the adjacent gate line GL on the base 1 are two adjacent sides, such as a lower side of the orthographic projection of the first electrode 8 on the base 1 and a upper side of the orthographic projection of the adjacent gate line GL on the base 1 shown in FIG. 3. It will be noted that as shown in FIG. 3, the upper side of the orthographic projection of the adjacent gate line GL on the base 1 has multiple portions that are not on the same line, and the maximum distance refers to the distance between the lower side of the orthographic projection of the first electrode 8 on the base 1 and the portion, which is farthest from the first electrode 8, of the upper side of the orthographic projection of the adjacent gate line GL on the base 1.

In some examples, as shown in FIG. 3, in a direction perpendicular to the extending direction of the data line DL (i.e., in the first direction X), a distance D2 between a second side of the orthographic projection of the first electrode 8 on the base 1 and a first side of an orthographic projection of an adjacent data line DL on the base 1 is approximately 2 μm to approximately 4 μm, such as 2 μm, 2.5 μm, 3 μm, 3.5 μm, or 4 μm. It will be noted that the second side of the orthographic projection of the first electrode 8 on the base 1 and the first side of the orthographic projection of the adjacent data line DL on the base 1 are two adjacent sides, such as a right side of the orthographic projection of the first electrode 8 on the base 1 and a left side of the orthographic projection of the adjacent date line DL on the base 1 shown in FIG. 3.

It will be noted that, the adjacent gate line GL and the adjacent data line DL refer to the gate line GL and the data line DL connected to the sub-pixel 10 where the first electrode 8 is arranged, respectively.

In this way, the first electrode 8 in each sub-pixel region S may have a large area, and the charging speed of the storage capacitor C may not be affected.

In some embodiments, an orthographic projection of the second electrode 9 on the base 1 is within a range of the orthographic projection of the first electrode 8 on the base 1. That is, an area of the second electrode 9 is smaller than or equal to an area of the first electrode 8.

In some examples, a distance between at least a portion of a border of the orthographic projection of the second electrode 9 on the base 1 and a corresponding portion of a border of the orthographic projection of the first electrode 8 on the base 1 is approximately 0 μm to approximately 2 μm, such as 0 μm, 0.5 μm, 1 μm, 1.5 μm or 2 μm. On this basis, the second electrode 9 in the sub-pixel region S has a large area, and the influence on the charging speed of the storage capacitor C may be avoided.

Figure 9A:
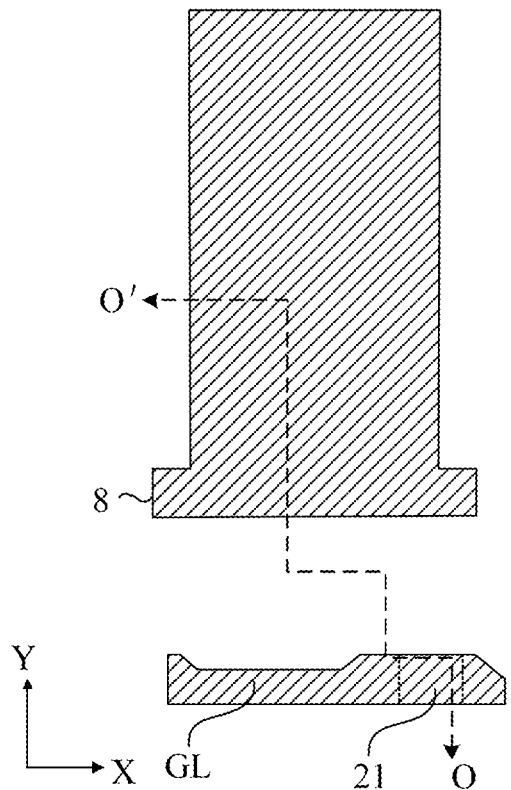
FIGS. 9A to 9E are schematic diagrams showing a process of forming an array substrate, according to some embodiments.
Figure 9B:
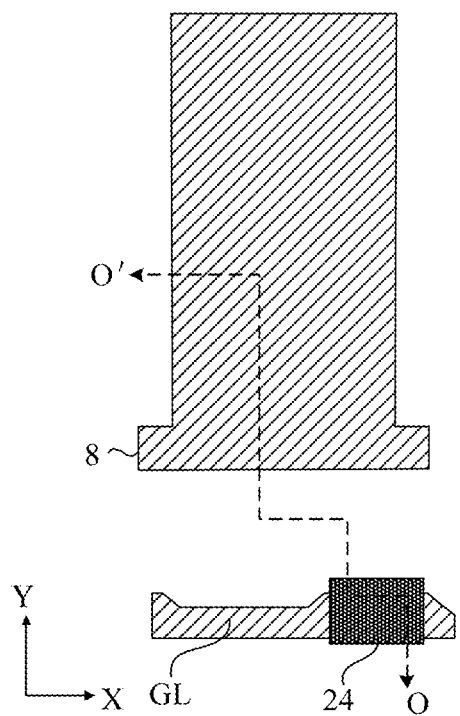
Figure 9C:
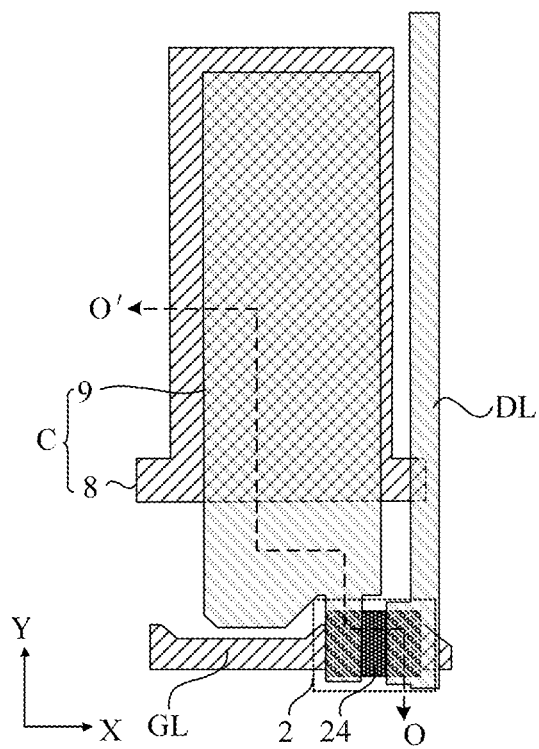

It will be noted that, as shown in FIGS. 3 and 9C, the distance between the at least a portion of the border of the orthographic projection of the second electrode 9 on the base 1 and the corresponding portion of the border of the orthographic projection of the first electrode 8 on the base 1 may be a distance between one side of the orthographic projection of the second electrode 9 on the base 1 and a corresponding side of the orthographic projection of the first electrode 8 on the base 1 in the first direction X or the second direction Y. Alternatively, the distance between the at least a portion of the border of the orthographic projection of the second electrode 9 on the base 1 and the corresponding portion of the border of the orthographic projection of the first electrode 8 on the base 1 may be a distance between each side of the orthographic projection of the second electrode 9 on the base 1 and a corresponding side of the orthographic projection of the first electrode 8 on the base 1 in the first direction X or the second direction Y. For example, the distance between the left side of the orthographic projection of the second electrode 9 on the base 1 and the left side of the orthographic projection of the first electrode 8 on the base 1 in the first direction X may be 0 μm, 0.5 μm, 1 μm, 1.5 μm or 2 μm, and the other sides of the orthographic projections of the first electrode 8 and the second electrode 9 on the base 1 may coincide correspondingly; or, the distance between each side of the orthographic projection of the second electrode 9 on the base 1 and a corresponding side of the orthographic projection of the first electrode 8 on the base 1 in the first direction X or the second direction Y may be 0.5 μm, 1 μm, 1.5 μm, or 2 μm.

According to the embodiments described above, by limiting the distance between the orthographic projections of the first electrode 8 and the corresponding gate line GL on the base 1, the distance between the orthographic projections of the first electrode 8 and the corresponding data line GL on the base 1, and the distance between borders of the orthographic projections of the first electrode 8 and the second electrode 9 on the base 1, the overlap area between the first electrode 8 and the second electrode 9 may be increased, and thus the storage capacitor C may have a larger capacitance, and then stores more charges. In this way, the discharging time of the storage capacitor C may be prolonged, thereby making the LCD including the array substrate 100 work in a low frequency, and realizing low power consumption.

Figure 6:
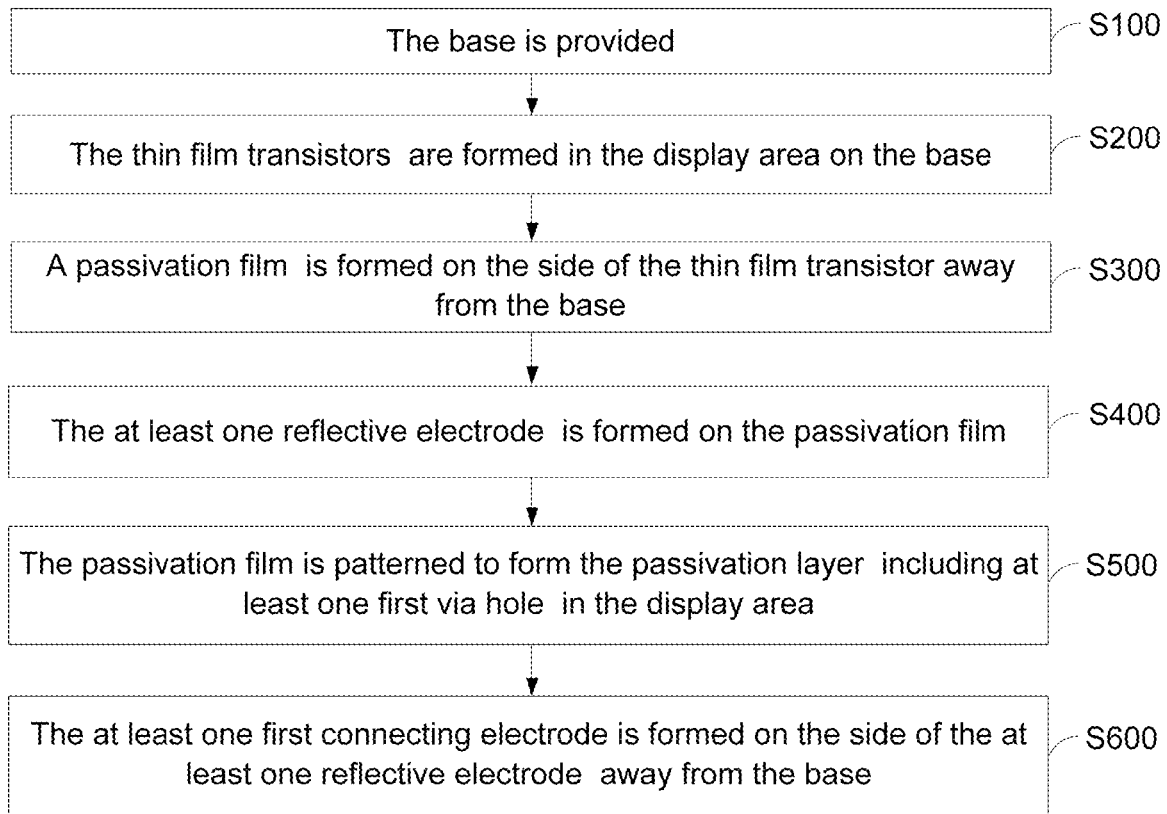
FIG. 6 is a flowchart of a method of manufacturing an array substrate, according to some embodiments.

In some embodiments, a method of manufacturing the array substrate 100 is provided. As shown in FIG. 6, the method includes S100 to S600.

In S100, the base 1 is provided. The base 1 has the display area A and the peripheral area B located on a periphery of the display area A.

Herein, the structure of the base 1 and the position relation between the display area A and the peripheral area B may refer to the description in the above embodiments of the array substrate 100, and will not be introduced in detail here.

In S200, as shown in FIGS. 9A to 10D, the thin film transistors 2 are formed in the display area A on the base 1. Each thin film transistor 2 includes a gate 21, a source 22 and a drain 23.

It will be noted that, the structure of the thin film transistor 2 may be determined according to actual needs. For example, the thin film transistor 2 may be a bottom-gate thin film transistor or a top-gate thin film transistor.

For example, the thin film transistor 2 is the bottom-gate thin film transistor, and the S200 includes S210 to S240.

Figure 10A:
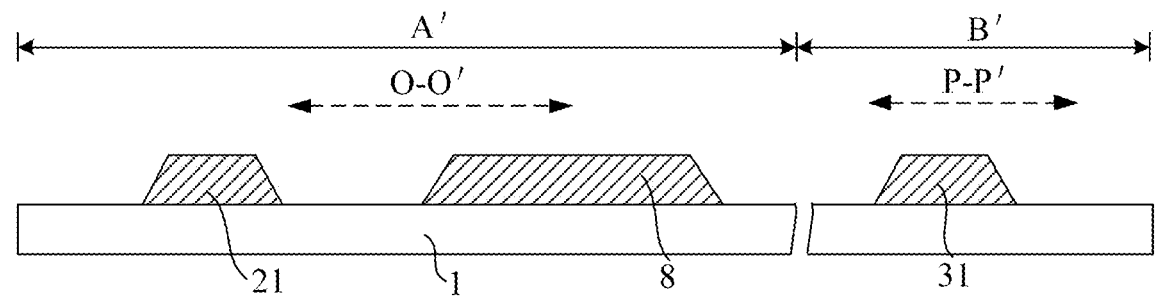
FIGS. 10A to 10I are schematic cross-sectional diagrams taken along the line P-P' in FIG. 2 and the line O-O' in FIG. 3, which show a process of forming the array substrate, according to some embodiments.

In S210, as shown in FIGS. 9A and 10A, the first conductive layer is formed on the base 1, and the first conductive layer includes a plurality of gate lines GL and gates 21, all of which are arranged in the display area A.

For example, forming the first conductive layer on the base 1 includes: depositing a first metal conductive film on the base 1; and patterning the first metal conductive film through a patterning process (such as a photomask process) to form the gate lines GL and the gates 21 in the display area A.

In some examples, the gate line GL and the gates 21 arranged in a row may be formed as an insulating structure.

The first metal conductive film may be made of a metal material such as silver (Ag), copper (Cu), Aluminum (AI) or molybdenum (Mo), or may be made of an alloy material of the metal materials. The first metal conductive film may have a structure of a single-layer film or a structure composed of multiple films stacked.

Figure 10B:
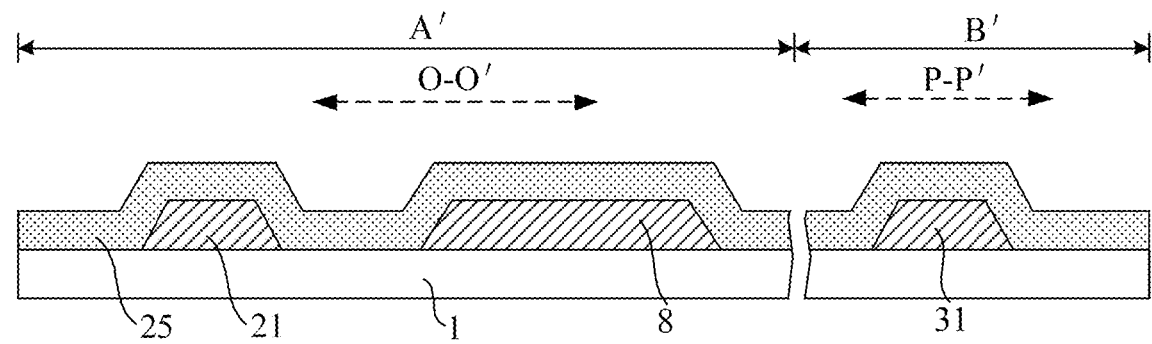

In S220, as shown in FIG. 10B, the gate insulating layer 25 is formed on the side of the first conductive layer away from the base 1.

For example, the gate insulating layer 25 may be made of silicon oxide (SiOx), silicon nitride (SiNx), silicon oxynitride (SiON), aluminum oxide (AlOx), hafnium oxide (HfOx), or tantalum oxide (TaOx). The gate insulating layer 25 may be formed by a single-layer film, a multi-layer film, or a composite-layer film. The gate insulating layer 25 may be formed by a deposition process such as CVD, or plasma enhanced chemical vapor deposition (PECVD).

Figure 10C:
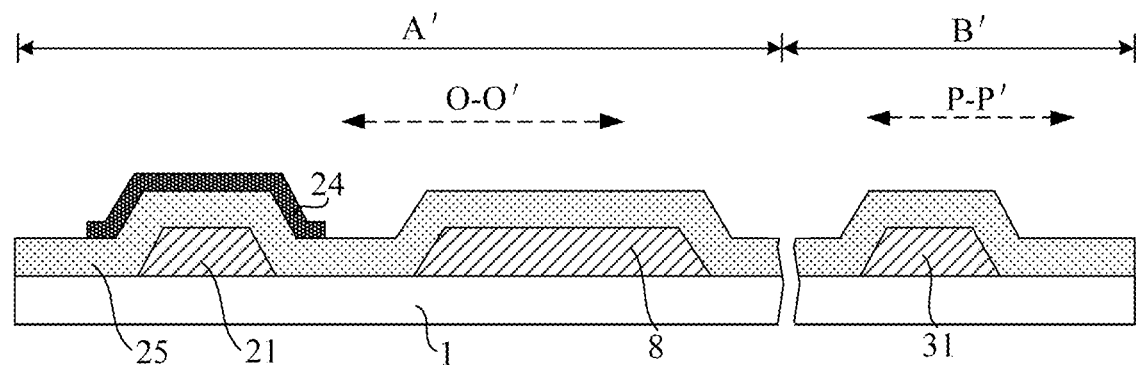

In S230, as shown in FIGS. 9B and 10C, the active layer 24 is formed in the display area A on the gate insulating layer 25.

In some examples, forming the active layer 24 includes: forming an active film on the gate insulating layer 25; and patterning the active film by a patterning process (such as a photomask process) to form the active layer 24. An orthographic projection of the active layer 24 on the base 1 overlaps with an orthographic projection of the gate 21 on the base 1.

Figure 10D:
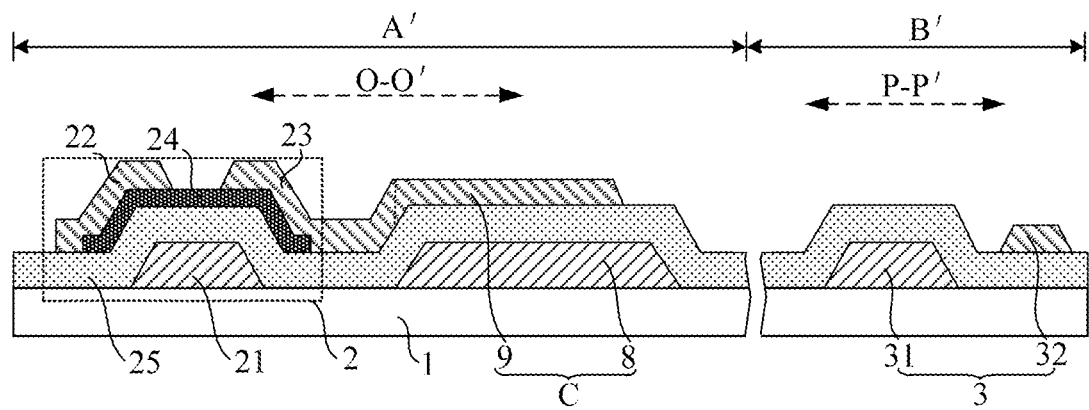

In S240, as shown in FIGS. 9C and 10D, the second conductive layer is formed on the active layer 24. The second conductive layer includes the data lines DL, the sources 22 and the drains 23 which are arranged in the display area A. The source 22 and drain 24 are connected to the active layer 24, and the data lines DL and the gate lines GL cross.

In some examples, forming the second conductive layer includes: forming a second metal conductive film on the active layer 24; and patterning the second metal conductive film by the patterning process (such as a photomask process) to form the data lines DL, the sources 22 and the drains 23. The source 22 or the drain 23 is insulating formed with a corresponding data line DL.

In some examples, the second metal conductive film may be made of a metal material such as Ag, Cu, Al, or Mo, or may be made of an alloy material of the metal materials. The second metal conductive film may have a structure of a single-layer film or a structure composed of multiple films stacked.

After S200, the method of manufacturing the array substrate 100 further includes S300 to S600.

Figure 10E:
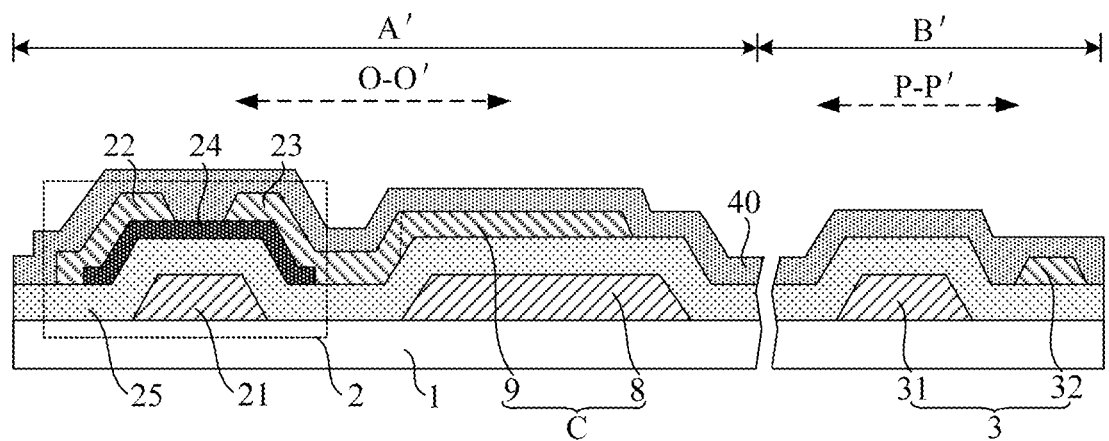

In S300, as shown in FIG. 10E, a passivation film 40 is formed on the side of the thin film transistor 2 away from the base 1.

In some examples, the passivation film 40 may be made of a material such as SiOx, SiNx, AlOx, HfOx, or TaOx. The passivation film 40 may formed by a single-layer film, a multi-layer film, or a composite-layer film. The passivation film 40 may be formed by a deposition process such as CVD or PECVD.

In some embodiments, as shown in FIGS. 10A to 10D, before the passivation film 40 is formed, the method further includes: forming a plurality of signal lines 3 in the peripheral area B while forming the thin film transistors 2. The passivation film 40 covers the thin film transistors 2 and the plurality of signal lines 3.

In some examples, as shown in FIGS. 10A to 10D, in the case where the plurality of signal lines 3 include a plurality of first signal lines 31 and a plurality of second signal lines 32, forming the plurality of signal lines 3 includes: forming the plurality of first signal lines 31 while forming the gate 21, and forming the plurality of second signal lines 32 while forming the source and the drain.

Figure 9D:
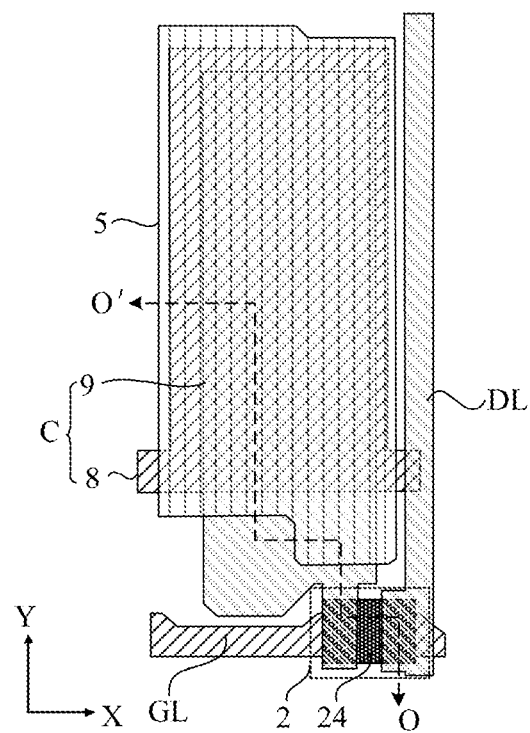
Figure 9E:
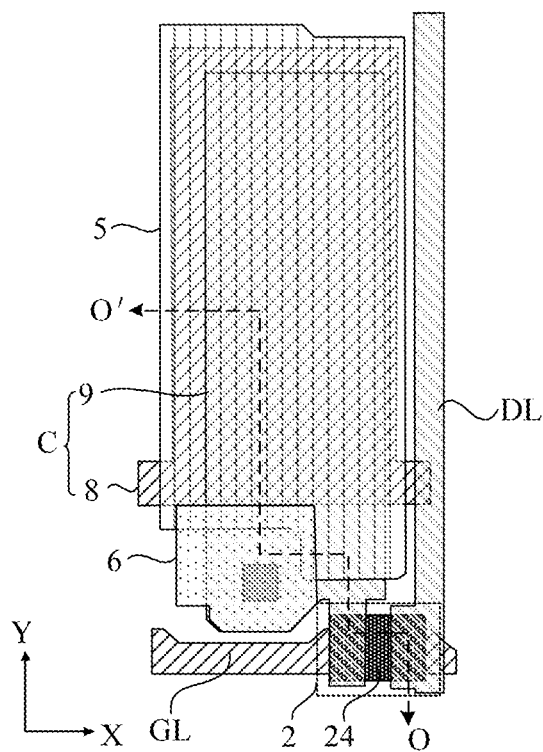
Figure 10F:
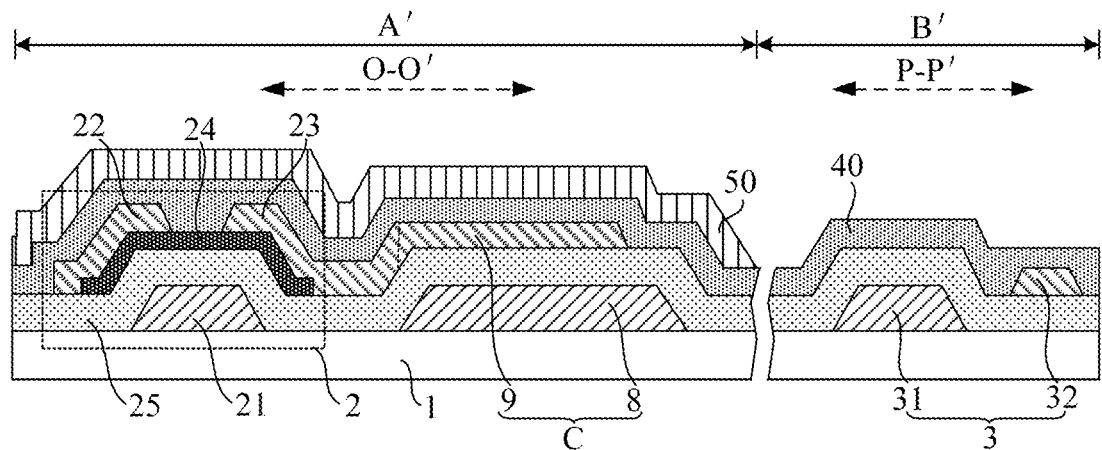
Figure 10G:
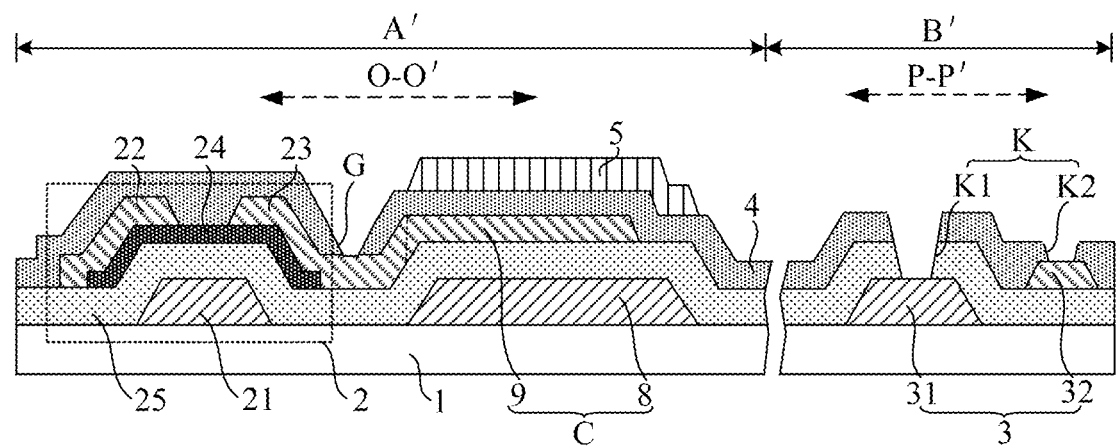

In S400, as shown in FIGS. 9D and 10G, the at least one reflective electrode 5 is formed on the passivation film 40.

Figure 7:
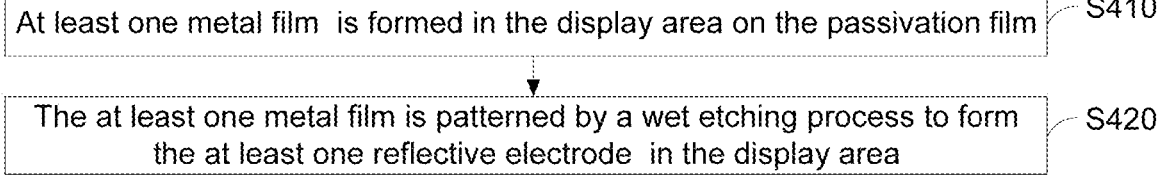
FIG. 7 is a flowchart of a method of forming at least one reflective electrode, according to some embodiments.

In some examples, as shown in FIG. 7, forming the at least one passivation electrode 5 includes S410 and S420.

In S410, as shown in FIG. 10F, at least one metal film 50 is formed in the display area A on the passivation film 40.

For example, the material of the at least one metal film 50 may be a material with high light reflectivity, such as Al. The at least one metal film 50 may be formed by a magnetron sputtering process.

In S420, as shown in FIGS. 9D and 10G, the at least one metal film 50 is patterned by a wet etching process to form the at least one reflective electrode 5 in the display area A.

A portion of the passivation film 40 is not covered by the at least one reflective electrode 5.

Herein, since the passivation film 40 is a complete film and covers the thin film transistors 2 and the signal lines 3, in the process of etching the at least one metal film 50 to form the at least one reflective electrode 5, the etching solution used in the wet etching process may be blocked by the passivation film 40, and thus the etching solution only etches the at least one metal film 50 that is disposed on the passivation film 40, thereby protecting the thin film transistors 2 and the signal lines 3 which are arranged on the side of the passivation film 40 proximate to the base 1 from being corroded by the etching solution.

In some embodiments, the reflective electrode 5 is a single-layer film made of Al.

It will be noted that, the reflective layer in the related art is usually has a structure of three-layer films (such as, a Mo layer, an Al layer and another Mo layer) stacked sequentially, which makes the formation process of the reflective layer need several times of sputtering processes. In addition, the light reflectivity of the reflective layer is low. In the embodiments of the present disclosure, the reflectivity of the reflective electrode 5 is high, and the times of the magnetron sputtering processes used in the formation process of the reflective electrode 5 may also be reduced, thereby reducing the time of forming the reflective electrode 5, and further improving the efficiency of manufacturing the array substrate 100.

In 8500, as shown in FIG. 10G, the passivation film 40 is patterned to form the passivation layer 4 including at least one first via hole G in the display area A.

For example, the passivation layer 4 may be formed by performing a photoetching process on the passivation film 40.

In some embodiments, the at least one first via hole G is used for exposing the source 22 or the drain 23. The first via hole G is formed in a portion of the passivation film 40 that is not covered by the at least one reflective electrode 5.

In some embodiments, the passivation layer 4 further has second via holes K in the peripheral area B. The second via holes K are used for exposing the signal lines 3 arranged in the peripheral area B.

In some examples, in the case where the signal lines 3 include at least one first signal line 31 and at least one second signal line 32, the second via holes K include at least one first contact via hole K1 and at least one second contact via hole K2.

Figure 10H:
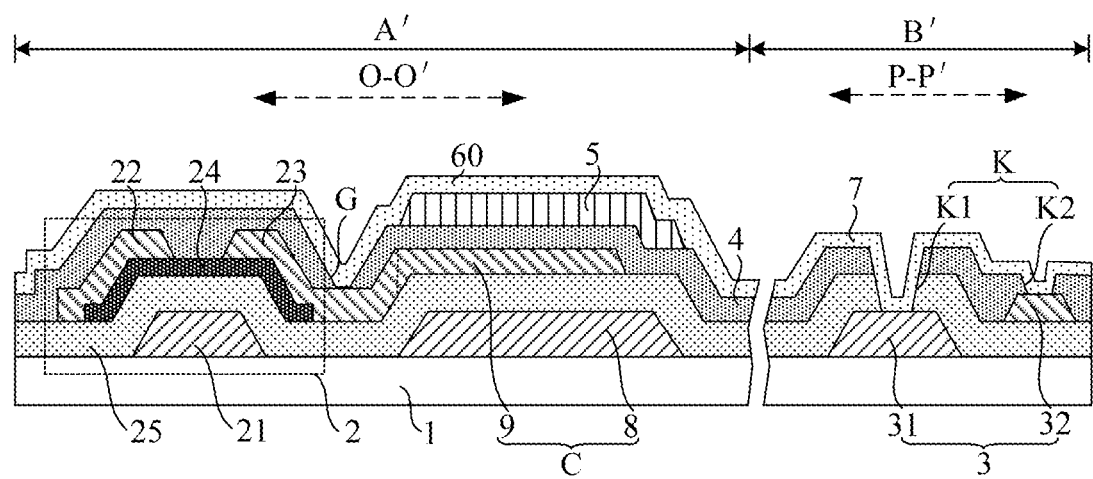
Figure 10I:
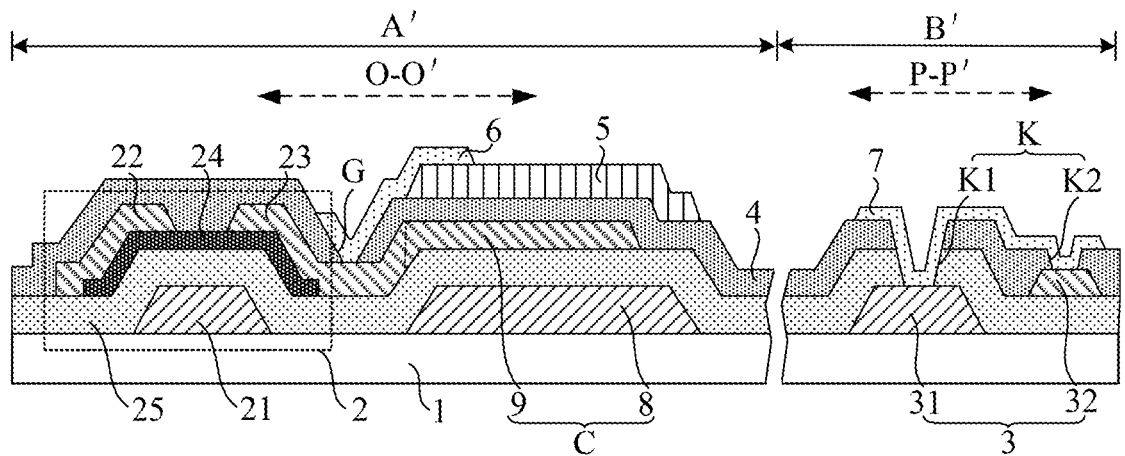

In S600, as shown in FIG. 10I, the at least one first connecting electrode 6 is formed on the side of the at least one reflective electrode 5 away from the base 1. A portion of the first connecting electrode 6 is formed on the surface of the reflective electrode 5 facing away from the base, and another portion of the first connecting electrode 6 is formed on the surface of the passivation layer 4 facing away from the base 1 and is connected to the source 22 or the drain 23 through the first via hole G.

In some embodiments, as shown in FIG. 10G, after the at least one reflective electrode 5 is formed, the method further includes: forming at least one second connecting electrode 7 in the peripheral area on the passivation layer 4 while forming the at least one first connecting electrode 6. Each second connecting electrode 7 is connected to two corresponding signal lines 3 through two corresponding second via holes.

For example, a portion of the second connecting electrode 7 is formed on the surface of the passivation layer 4 facing away from the base 1, and the other portion of the second connecting electrode 7 is formed in the second via holes K and is connected to the signal lines 3 through the second via holes K.

In the case where the signal lines 3 include first signal lines 31 and second signal lines 32, and the at least one second via hole K includes first contact via holes K1 and second contact via holes K2, the two corresponding second via holes include one first contact via hole K1 and one second contact via hole K2, and the two corresponding signal lines 3 include one first signal line 31 and one second signal line 32. That is to say, the second connecting electrode 7 is connected to a first signal line 31 through a first contact via hole K1, and is connected to a second signal line 32 through a second contact via hole K2.

Figure 8:
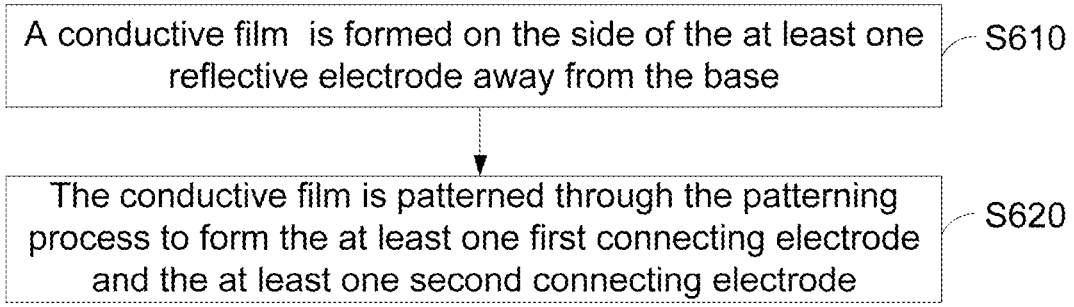
FIG. 8 is a flowchart of a method of forming at least one first connecting electrode and at least one second connecting electrode, according to some embodiments.

In some examples, as shown in FIG. 8, forming the at least one first connecting electrode 6 and the at least one second connecting electrode 7 includes S610 and S620.

In S610, as shown in FIG. 10H, a conductive film 60 is formed on the side of the at least one reflective electrode 5 away from the base 1.

In some examples, the conductive film 60 may be made of a material with high light transmittance, such as amorphous indium tin oxide (α-ITO). For example, the conductive film 60 may be formed by a magnetron sputtering process or a PECVD process.

Herein, the conductive film 60 is formed in both the display area A and the peripheral area B, and the conductive film 60 covers the reflective electrode 5 and a portion of the passivation layer 4 which is not covered by the reflective electrode 5.

In S620, as shown in FIG. 10I, the conductive film 60 is patterned through the patterning process to form the at least one first connecting electrode 6 and the at least one second connecting electrode 7.

For example, the conductive film 60 may be patterned by a photoetching process or a wet etching process.

In the case where the conductive film 60 is patterned by the wet etching process, the material of the conductive film 60 may be α-ITO, and the material of the metal film 50 may be Al. In this way, the etching solution will not act on the Al in the process of etching the conductive film 60, thereby avoiding the reflective electrode 5 being corroded by the etching solution.

In the method of manufacturing the array substrate 100 provided by some embodiments of the present disclosure, when the reflective electrode 5 is formed, the passivation film 40 has not been patterned. Therefore, the passivation film 40 may protect the thin film transistor 2 and the signal line 3, and prevent the thin film transistor 2 and the signal line 3 from being corroded by the etching solution in the process of forming the reflective electrode 5, thereby improving the quality of the array substrate 100.

In addition, compared with the related art, the patterning processes used in the manufacturing process of the array substrate 100 may not be increased, and the process of forming the thin film transistor 2, the signal line 3 and the passivation film 40 on the base 1 is basically the same as that in the related art. Therefore, the equipment used for forming the thin film transistor 2, the signal line 3 and the passivation film 40 in the related art is still applicable in the manufacturing process of the array substrate 100. It means that there is no need to change the equipment in the related art, which makes the method of manufacturing the array substrate 100 provided by the embodiments of the present disclosure have high process compatibility, high practicability, and good application prospect.

In some embodiments, as shown in FIGS. 9A and 10A, the method of manufacturing the array substrate further includes: forming at least one first electrode 8 in the display area A while forming the gate 21. That is, the first electrode 8 and the gate 21 may be arranged in the same layer. The at least one first electrode 8 may include a plurality of first electrodes 8 electrically connected.

In some embodiments, as shown in FIGS. 9C and 10D, the method of manufacturing the array substrate 100 further includes: forming at least one second electrode 9 in the display area A while forming the source 22 and the drain 23. That is, the second electrode 9, the source 22 and the drain 23 may be arranged in the same layer.

The first electrode 8, the second electrode 9 and a portion of an insulating layer therebetween may constitute a storage capacitor C. The storage capacitor C may store charges when the thin film transistor 2 is turned on, and may provide charges to the reflective electrode 5 when the thin film transistor 2 is turned off.

Figure 11:
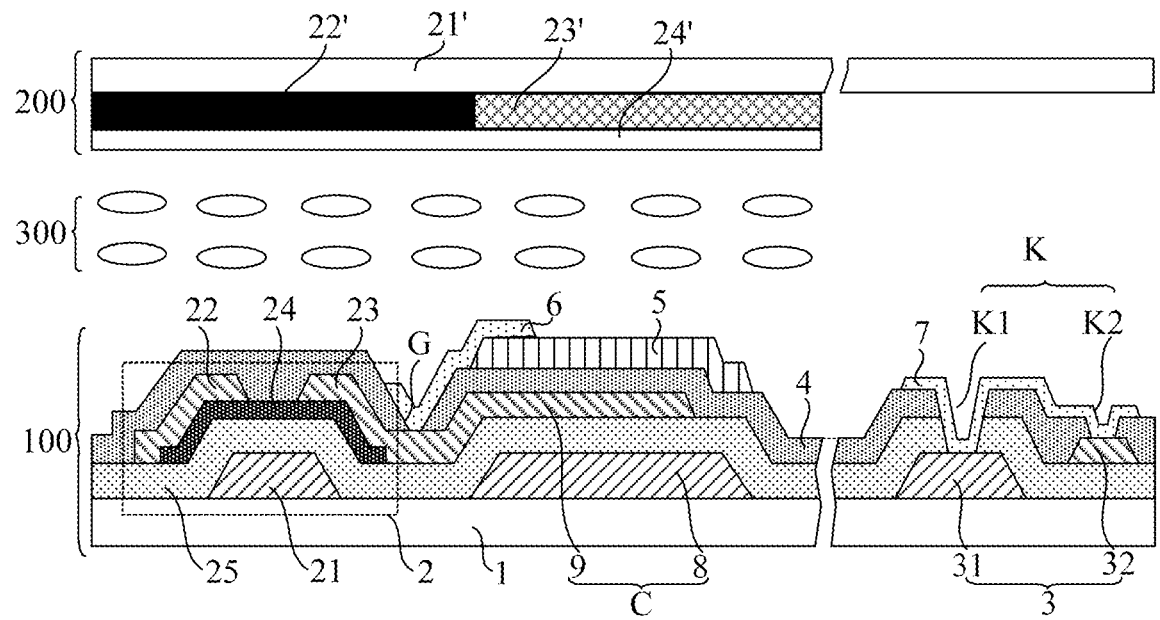
FIG. 11 is a structural diagram of a display apparatus, according to some embodiments.
Figure 12:
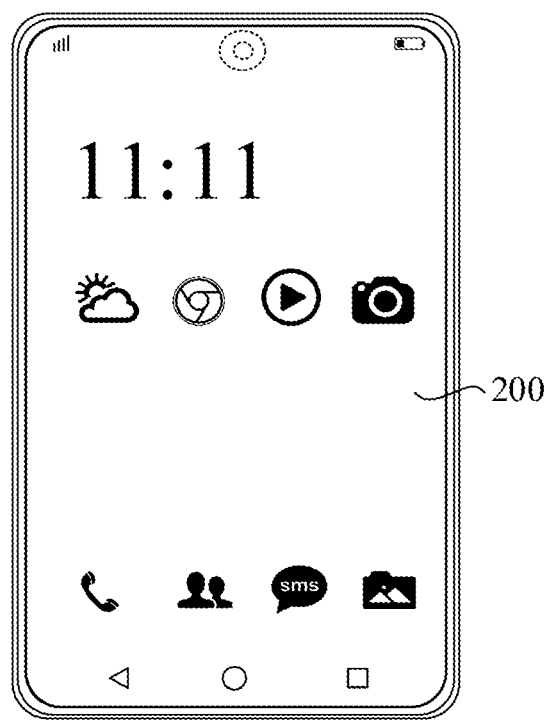
FIG. 12 is a top view of a display apparatus, according to some embodiments.

In some embodiments, as shown in FIGS. 11 and 12, a display apparatus 1000 is provided. The display apparatus 1000 includes the array substrate 100 described in above embodiments, an opposite substrate 200, and a liquid crystal layer 300. The opposite substrate 200 is arranged opposite to the array substrate 100, and the liquid crystal layer 300 is disposed between the array substrate 100 and the opposite substrate 200.

In some examples, as shown in FIG. 11, the opposite substrate 200 includes an opposite base 21' and a black matrix 22'. The black matrix 22' is arranged on the side of the opposite base 21' proximate to the array substrate 100.

The black matrix 22' is configured to shield light incident onto the gate lines GL, the data lines DL and the thin film transistors 2 in the array substrate 100. The orthographic projections of the gate lines GL, the data lines DL and the thin film transistors 2 on the base 1 are within the range of the orthographic projection of the black matrix 22' on the base 1, which may ensure that the display apparatus 1000 has good display effect.

In some examples, as shown in FIG. 11, the opposite substrate 200 further includes a color filter layer 23' disposed on the side of the opposite base 21' proximate to the array substrate 100. The color filter layer 23' includes a plurality of color filter, such as red filters, blue filters, and green filters.

In some examples, as shown in FIG. 11, the opposite substrate 200 further includes a common electrode 24' arranged on the side of the color filter layer 23' proximate to the array substrate 100. The common electrode 24' may cooperate with the reflective electrode 5 in the array substrate 100 to generate an electric field therebetween to drive liquid crystal molecules in the liquid crystal layer 300 to deflect, so that the display apparatus 1000 can realize image display.

The liquid crystal molecules in the liquid crystal layer 300 may be of various types. For example, the liquid crystal molecules may be positive liquid crystal molecules, or negative liquid crystal molecules.

The beneficial effects of the display apparatus 1000 are the same as the beneficial effects of the array substrate 100 provided by some embodiments of the present disclosure, and thus will be not repeated here.

The display apparatus 1000 may be a display apparatus of a twisted nematic (TN) display mode, or may be a display apparatus of an in plane switching (IPS) display mode, or may be a display apparatus of an advanced super dimension switching (ADS) display mode.

In some embodiments, the display apparatus 1000 may be any product or part having a display function, such as a mobile phone, a tablet personal computer, a television, a display, a notebook computer, a digital photo frame, or a navigator. The display apparatus 1000 may be also a wearable electronic device such as a smart watch, or a smart bracelet.

The smart bracelet (watch) is more and more popular due to its portability or functions of timing, counting steps, sleep monitoring, and color display. When the display apparatus 1000 is the smart bracelet (watch), the endurance time of the smart bracelet (watch) may be effectively increased.

The forgoing descriptions are merely specific implementation of the present disclosure, but the protection scope of the present disclosure is not limited thereto. Any person skilled in the art could readily conceive of changes or replacements within the technical scope disclosed by the present disclosure, which shall all be included the protection scope of the present disclosure. Therefore, the protection scope of the present disclosure should be subjected to the protection scope of the claims.

What is claimed is:

1. An array substrate having a display area, the array substrate comprising:
    a base;
    a plurality of thin film transistors disposed in the display area on the base, each thin film transistor including a gate, a source and a drain;
    a passivation layer covering the thin film transistors, the passivation layer having at least one first via hole in the display area;
    at least one reflective electrode disposed on a surface of the passivation layer facing away from the base, the at least one reflective electrode being disposed in the display area and uncovering the at least one first via hole;
    at least one first connecting electrode disposed on a side of the at least one reflective electrode away from the base;
    at least one first electrode disposed in the display area, the at least one first electrode being disposed in a same layer as the gate of the thin film transistor; and
    at least one second electrode disposed in the display area, the at least one second electrode being disposed in a same layer as the source and the drain of the thin film transistor, and each second electrode being connected to a corresponding source or a corresponding drain,
        wherein each first connecting electrode is connected to a corresponding reflective electrode, and is connected to a source or a drain of a corresponding thin film transistor through a corresponding first via hole;
    an orthographic projection of a first electrode on the base and an orthographic projection of a corresponding second electrode on the base overlap;
    an orthographic projection of each second electrode on the base is within a range of an orthographic projection of a corresponding first electrode on the base; and
    a distance between at least a portion of a border of the orthographic projection of the second electrode on the base and a corresponding portion of a border of the orthographic projection of the corresponding first electrode on the base is approximately 0 μm to approximately 2 μm.

2. The array substrate according to claim 1, wherein the array substrate further has a peripheral area located on a periphery of the display area, and the array substrate further comprises:
    a plurality of signal lines disposed in the peripheral area on the base, wherein the passivation layer further covers the signal lines and has a plurality of second via holes exposing the signal lines; and
    at least one second connecting electrode disposed in the peripheral area, wherein the at least one second connecting electrode is disposed on the surface of the passivation layer facing away from the base, and each second connecting electrode is connected to two corresponding signal lines through two corresponding second via holes.

3. The array substrate according to claim 2, wherein the plurality of signal lines include at least one first signal line disposed in a same layer as the gate of the thin film transistor, and at least one second signal line disposed in a same layer as the source and the drain of the thin film transistor;
    the plurality of second via holes include at least one first contact via hole and at least one second contact via hole, and each second connecting electrode is connected to a corresponding first signal line through a corresponding first contact via hole, and is connected to a corresponding second signal line through a corresponding second contact via hole.

4. The array substrate according to claim 3, wherein the gate of the thin film transistor is closer to the base than the source and the drain of the thin film transistor;
    the array substrate further comprises a gate insulating layer disposed between the gate and both the source and the drain, and the at least one first contact via hole further passes through the gate insulating layer; and
    the thin film transistor further includes an active layer disposed between the gate and both the source and the drain, and the active layer is connected to both the source and the drain.

5. The array substrate according to claim 3, wherein the gate of the thin film transistor is closer to the base than the source and the drain of the thin film transistor;
    the thin film transistor further includes an active layer disposed between the gate and the base; and
    the array substrate further comprises:
    a gate insulating layer disposed between the gate and the active layer; and
    an interlayer insulating layer disposed between the gate and both the source and the drain, wherein the at least one first contact via hole further passes through the interlayer insulating layer, wherein
    the source and the drain of the thin film transistor are connected to the active layer through respective via holes passing through both the interlayer insulating layer and the gate insulating layer.

6. The array substrate according to claim 1, further comprising:
    a plurality of gate lines arranged in the display area, the gate lines being disposed in a same layer as the gate, and extending along a first direction; and
    a plurality of data lines arranged in the display area, the data lines being disposed in a same layer as the source and the drain of the thin film transistor, and extending along a second direction perpendicular to the first direction, wherein
    in the second direction, a maximum distance between a first side of an orthographic projection of a first electrode on the base and a first side of an orthographic projection of an adjacent gate line on the base is approximately 2 μm to approximately 4 μm, wherein the first side of the orthographic projection of the first electrode on the base and the first side of the orthographic projection of the adjacent gate line on the base are two adjacent sides, and in the first direction, a distance between a second side of the orthographic projection of the first electrode on the base and a first side of an orthographic projection of an adjacent data line on the base is approximately 2 µm to approximately 4 µm, wherein the second side of the orthographic projection of the first electrode on the base and the first side of the orthographic projection of the adjacent data line on the base are two adjacent sides.

7. The array substrate according to claim 1, wherein the second electrode is integrally formed with a source or a drain of a corresponding thin film transistor.

8. The array substrate according to claim 2, wherein materials of the at least one first connecting electrode and the at least one second connecting electrode include amorphous indium tin oxide.

9. The array substrate according to claim 8, wherein a material of the at least one reflective electrode includes aluminum.

10. A method of manufacturing the array substrate according to claim 1, the method comprising:
providing the base;
forming the thin film transistors in the display area on the base;
forming a passivation film on a side of the thin film transistors away from the base;
forming the at least one reflective electrode in the display area on the passivation film, a portion of the passivation film being not covered by the at least one reflective electrode;
patterning the passivation film to form the passivation layer including the at least one first via hole that is uncovered by the at least one reflective electrode;
forming the at least one first connecting electrode on the side of the at least one reflective electrode away from the base, the at least one first connecting electrode being formed in the display area, a portion of the at least one first connecting electrode being formed on a surface of the passivation layer facing away from the base and passing through the at least one first via hole, another portion of the at least one first connecting electrode being formed on a surface of the at least one reflective electrode facing away from the base;
forming the at least one first electrode in the display area while forming the gate of the thin film transistor; and
forming the at least one second electrode in the display area while forming the source and the drain of the thin film transistor.

11. The method according to claim 10, wherein before forming the passivation film, the method further comprises:

forming a plurality of signal lines in a peripheral area of the array substrate while forming the thin film transistors, the passivation film covering the plurality of signal lines, and the passivation layer further having a plurality of second via holes in the peripheral area;

and wherein after forming the at least one reflective electrode, the method further comprises:

forming at least one second connecting electrode in the peripheral area on the passivation layer while forming the at least one first connecting electrode, each second connecting electrode being connected to two corresponding signal lines through two corresponding second via holes.

12. The method according to claim 11, wherein forming the at least one reflective electrode includes:
forming a metal film on the passivation film; and
patterning the metal film through a wet etching process to form the at least one reflective electrode.

13. The method according to claim 11, wherein the plurality of signal lines include at least one first signal line and at least one second signal line, and the plurality of second via holes includes at least one first contact via hole and at least one second contact via hole, forming the plurality of signal lines includes:
forming the at least one first signal line while forming the gate of the thin film transistor, and forming the at least one second signal line while forming the source and the drain of the thin film transistor; and patterning the passivation film to form the passivation layer includes:
patterning the passivation film through a patterning process to form the at least one first via hole, the at least one first contact via hole, and the at least one second contact via hole;

each first via hole exposing a source or a drain of a corresponding thin film transistor, each first contact via hole exposing a corresponding first signal line, and each second contact via hole exposing a corresponding second signal line.

14. The method according to claim 11, wherein forming the at least one first connecting electrode and the at least one second connecting electrode includes:
forming a conductive film on a side of the at least one reflective electrode away from the base; and
patterning the conductive film through a patterning process to form the at least one first connecting electrode and the at least one second connecting electrode.

15. A display apparatus, comprising:
the array substrate according to claim 1;
an opposite substrate disposed opposite to the array substrate; and
a liquid crystal layer disposed between the array substrate and the opposite substrate.

* * * * *